United States Patent
Seong et al.

(10) Patent No.: US 10,263,157 B2
(45) Date of Patent: Apr. 16, 2019

(54) LIGHT-EMITTING DIODE WITH TRANSPARENT CONDUCTIVE ELECTRODES FOR IMPROVEMENT IN LIGHT EXTRACTION EFFICIENCY

(71) Applicants: Tae Yeon Seong, Seoul (KR);
Dae-Hyun Kim, Seoul (KR);
Byoungjun Choi, Seoul (KR)

(72) Inventors: Tae Yeon Seong, Seoul (KR);
Dae-Hyun Kim, Seoul (KR);
Byoungjun Choi, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 46 days.

(21) Appl. No.: 15/629,106

(22) Filed: Jun. 21, 2017

(65) Prior Publication Data
US 2018/0026162 A1 Jan. 25, 2018

(30) Foreign Application Priority Data
Jul. 19, 2016 (KR) .................. 10-2016-0091166

(51) Int. Cl.
*H01L 33/42* (2010.01)
*H01L 33/06* (2010.01)
(Continued)

(52) U.S. Cl.
CPC .......... *H01L 33/42* (2013.01); *H01L 33/0062* (2013.01); *H01L 33/0079* (2013.01); *H01L 33/06* (2013.01); *H01L 33/14* (2013.01); *H01L 33/20* (2013.01); *H01L 33/22* (2013.01); *H01L 33/30* (2013.01); *H01L 33/387* (2013.01); *H01L 33/405* (2013.01); *H01L 33/44* (2013.01); *H01L 2933/0016* (2013.01)

(58) Field of Classification Search
CPC ........ H01L 33/0062–33/0079; H01L 33/0025; H01L 33/002; H01L 33/30–33/325
See application file for complete search history.

(56) References Cited

U.S. PATENT DOCUMENTS

2003/0218172 A1* 11/2003 Sugawara ............... H01L 33/20
257/72
2010/0065867 A1* 3/2010 Unno .................. H01L 33/0079
257/98
(Continued)

*Primary Examiner* — Changhyun Yi
(74) *Attorney, Agent, or Firm* — Andrew D. Fortney; Central California IP Group, P.C.

(57) ABSTRACT

A light-emitting diode device may include a conductive substrate, a metal reflection layer provided on the conductive substrate, a transparent insulating layer provided on the metal reflection layer, an n ohmic contact plug provided in a lower portion of each of through holes formed in the transparent insulating layer, an n-type gallium arsenide (GaAs) plug provided in an upper portion of the through hole, an n cladding layer provided on the transparent insulating layer, an active layer provided on the n cladding layer, a p cladding layer provided on the active layer, a p-type GaP window layer provided on the p cladding layer, a p ohmic contact pattern provided on the p-type GaP window layer, a transparent conductive metal oxide pattern provided on the p ohmic contact layer, and a p electrode pad provided on the transparent conductive metal oxide.

20 Claims, 11 Drawing Sheets

(51) Int. Cl.
*H01L 33/40* (2010.01)
*H01L 33/22* (2010.01)
*H01L 33/30* (2010.01)
*H01L 33/14* (2010.01)
*H01L 33/00* (2010.01)
*H01L 33/20* (2010.01)
*H01L 33/38* (2010.01)
*H01L 33/44* (2010.01)

(56) References Cited

U.S. PATENT DOCUMENTS

2010/0078659 A1* 4/2010 Iizuka .................. H01L 33/405
   257/94
2017/0365755 A1* 12/2017 Chu ........................ H01L 33/56
2018/0047779 A1* 2/2018 Yang .................. H01L 29/0649

* cited by examiner

LIGHT-EMITTING DIODE WITH TRANSPARENT CONDUCTIVE ELECTRODES FOR IMPROVEMENT IN LIGHT EXTRACTION EFFICIENCY

CROSS-REFERENCE TO RELATED APPLICATIONS

This U.S. non-provisional patent application claims priority under 35 U.S.C. § 119 to Korean Patent Application No. 10-2016-0091166, filed on Jul. 19, 2016, in the Korean Intellectual Property Office, the entire contents of which are hereby incorporated by reference.

BACKGROUND OF THE INVENTION

The present disclosure relates to a light-emitting diode, and in particular, to an AlGaInP-based light-emitting diode (LED) device, allowing red or infrared light-emitting diodes to have improved light extraction efficiency.

The present disclosure also relates to a structure of a transparent electrode and a method of designing the same.

Generally, an epitaxial layer with a small band gap is used in a red or infrared LED, and an amount of light to be absorbed by an electrode is large. Thus, the red or infrared LED suffers from low light extraction efficiency. Technologies of reducing a thickness of the epitaxial layer or increasing optical transmittance of the electrode have been used to overcome these problems.

The red or infrared LEDs is classified into two types: a p-side up structure and an n-side up structure. For the p-side up structure, when an epitaxial layer is grown on a gallium arsenide (GaAs) substrate, a surface of a p-type epitaxial layer is located at the topmost level of the device. Thus, if the GaAs substrate is used as a part of the LED device, most of light generated in the active layer may be absorbed by the GaAs substrate with a small band gap, and thus, the LED device suffers from low optical power.

To overcome this problem, the n-side up LED structure was introduced. For the n-side up LED structure, to reduce an amount of light to be absorbed by the GaAs substrate, a wet etching process is performed to remove the GaAs substrate from the p-side up LED structure and to allow an n-type epitaxial layer to be positioned at the topmost level of the device. In this structure, since the GaAs substrate is removed by the wet etching process and a total thickness of the epitaxial layer is reduced, it is possible to reduce an absorption amount of light generated in the active layer and thereby to increase optical power.

However, for the n-side up LED structure, a current spreading layer and a window layer (e.g., GaP, AlGaAs, and so forth) are not provided at the topmost level. This may lead to a reduced current spreading effect in a lateral direction and may set a limitation on improvement of the light extraction efficiency. To overcome this problem, a p-side up omni-directional reflector (ODR) LED structure was suggested. For the p-side up ODR LED structure, a current spreading layer and a window layer are provided at the topmost level of the LED device, and an ODR structure is provided on or in an n-type semiconductor layer. In addition, since the GaAs substrate is removed, it is possible to prevent light from being absorbed by the substrate and thereby to increase optical power of the LED device. A metal (e.g., gold (Au)-based) electrode is provided at the topmost level of the p-side up ODR LED structure. However, even in this structure, light generated in the active layer may be absorbed by a metal electrode.

An electrode of a conventional red LED device is formed of gold or a gold alloy-based material, regardless of whether it is of the p-side up structure or an n-side up structure. However, the gold alloy-based electrode has low reflectance (e.g., of 85-88%) within a red wavelength range (e.g., of 600 nm-700 nm), and thus, an amount of light to be absorbed by the electrode is increased to reduce an overall light efficiency of the LED device. In addition, during a thermal treatment process, an inter-diffusion or inter-mixing phenomenon may occur in the electrode, and this may lead to a reduction in reflectance of a reflection electrode and a reduction in light extraction efficiency of the LED device.

In some embodiments, an ohmic contact layer and a transparent electrode are provided at the topmost level of the p-side up ODR LED device to increase an overall optical power of the LED device.

SUMMARY

Some embodiments of the inventive concept provide a p-side up LED structure that is configured to reduce optical loss, which may be caused by an upper electrode thereof.

Some embodiments of the inventive concept provide an LED structure including a thin ohmic electrode pattern and a transparent electrode pattern, which are provided below an electrode pad, and thereby having an improved current spreading property.

According to some embodiments of the inventive concept, a light-emitting diode (LED) device may include a conductive substrate, a metal reflection layer provided on the conductive substrate, a transparent insulating layer provided on the metal reflection layer, an n ohmic contact plug provided in a lower portion of each of through holes formed in the transparent insulating layer, an n-type gallium arsenide (GaAs) plug provided in an upper portion of the through hole, an n cladding layer provided on the transparent insulating layer, an active layer provided on the n cladding layer, a p cladding layer provided on the active layer, a p-type GaP window layer provided on the p cladding layer, a p ohmic contact pattern provided on the p-type GaP window layer, a transparent conductive metal oxide pattern provided on the p ohmic contact layer, and a p electrode pad provided on the transparent conductive metal oxide.

In some embodiments, a thickness of the p ohmic contact pattern may be less than or equal to 20 nm, the p ohmic contact pattern may include at least one of Au, AuBe, Ni, NiZn, NiBe, Pd, PdZn, or PdBe, and the transparent conductive metal oxide pattern may include at least one of indium tin oxide (ITO), ZnO, aluminum-doped zinc oxide (Al—ZnO, AZO), gallium-doped zinc oxide (GZO), or In—Ga ZnO (IGZO).

In some embodiments, the p ohmic contact pattern may be a 10 nm-thick Au layer, and the transparent conductive metal oxide pattern may be a 40 nm-thick ITO layer.

In some embodiments, the p ohmic contact pattern may be a 10 nm-thick AuBe layer, and the transparent conductive metal oxide pattern may be a 40 nm-thick IGZO layer.

In some embodiments, the n cladding layer may include an n-type AlGaInP layer and an n-type AlInP layer which are sequentially stacked, and the p cladding layer may include a p-type AlInP layer and a p-type AlGaInP layer which are sequentially stacked.

According to some embodiments of the inventive concept, a method of fabricating a light-emitting diode device may include sequentially stacking a first n-GaAs layer, an n-GaInP layer, a second n-GaAs layer, an n cladding layer, an active layer, a p cladding layer, and a p-type GaP layer on a GaAs substrate, forming a p ohmic contact pattern and a transparent conductive metal oxide pattern on the p-type GaP layer, forming a p electrode pad on the transparent conductive metal oxide pattern, bonding a temporary substrate on the p electrode pad and removing the GaAs substrate, the first n-GaAs layer, and the n-GaInP layer, patterning the second n-GaAs layer to form an n-type gallium arsenide (GaAs) plug, forming a transparent insulating layer on the n cladding layer and the n-type GaAs plug and patterning the transparent insulating layer to form an n ohmic contact plug aligned with the n-type GaAs plug, forming a metal reflection layer on the transparent insulating layer and the n ohmic contact plug and attaching a conductive substrate onto the metal reflection layer, and removing the temporary substrate.

In some embodiments, the method may further include thermally treating a substrate, on which the p ohmic contact pattern and the transparent conductive metal oxide pattern are formed, at temperature of 300° C.-400° C.

In some embodiments, a thickness of the p ohmic contact pattern may be less than or equal to 20 nm. The p ohmic contact pattern may include at least one of Au, AuBe, Ni, NiZn, NiBe, Pd, PdZn, or PdBe, and the transparent conductive metal oxide pattern includes at least one of indium tin oxide (ITO), ZnO, aluminum-doped zinc oxide (Al—ZnO, AZO), gallium-doped zinc oxide (GZO), or In—Ga ZnO (IGZO).

In some embodiments, the p ohmic contact pattern may be a 10 nm-thick Au layer and the transparent conductive metal oxide pattern may be a 40 nm-thick ITO layer.

In some embodiments, the p ohmic contact pattern may be a 10 nm-thick AuBe layer, and the transparent conductive metal oxide pattern may be a 40 nm-thick IGZO layer.

In some embodiments, the n cladding layer may include an n-type AlGaInP layer and an n-type AlInP layer which are sequentially stacked, and the p cladding layer may include a p-type AlInP layer and a p-type AlGaInP layer which are sequentially stacked.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1A:
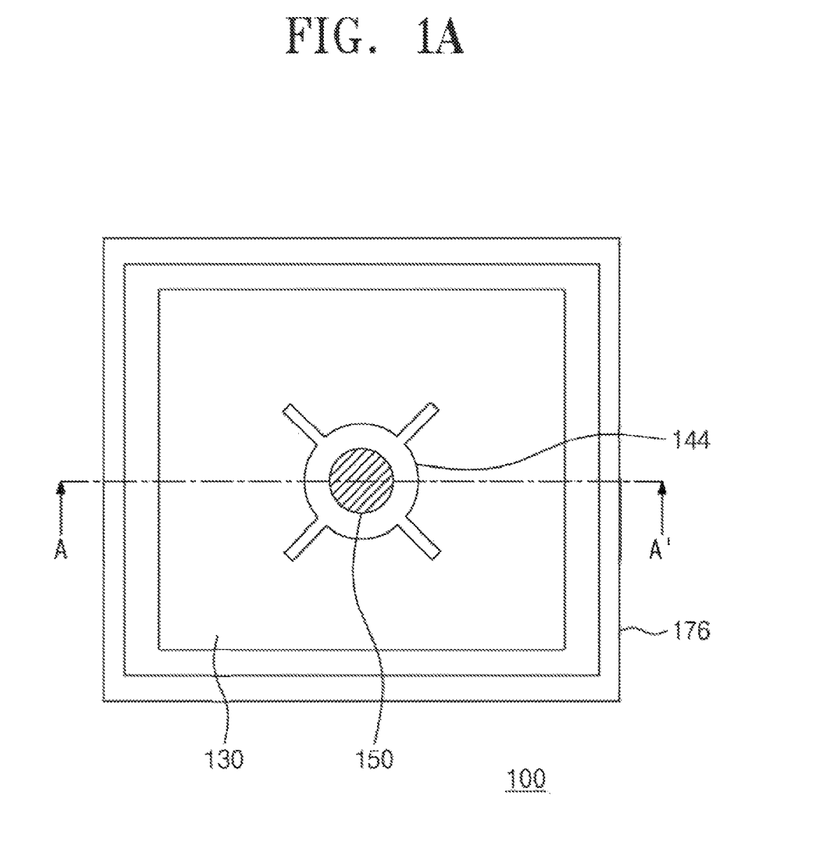
FIG. 1A is a plan view of a light-emitting diode device according to some embodiments of the inventive concept.

FIG. 1A is a plan view of a light-emitting diode device according to some embodiments of the inventive concept.

Figure 1B:
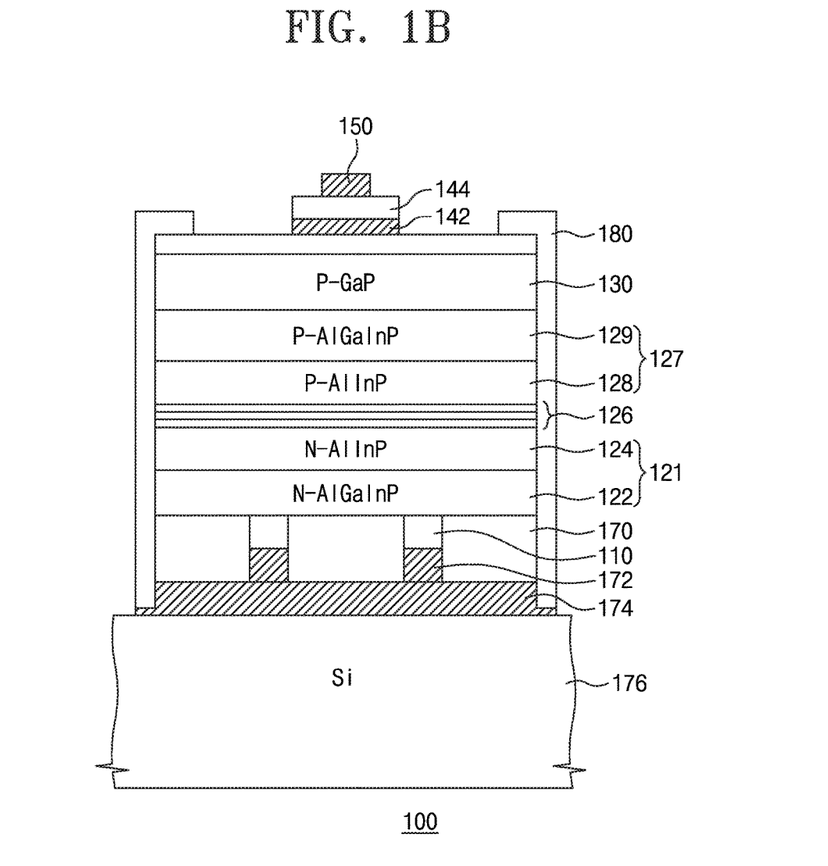
FIG. 1B is a sectional view taken along line A-A' of FIG. 1A.

FIG. 1B is a sectional view taken along line A-A' of FIG. 1A.

Referring to FIGS. 1A and 1B, a light-emitting diode device 100 may include a conductive substrate 176; a metal reflection layer 174 provided on the conductive substrate 176; a transparent insulating layer 170 provided on the metal reflection layer 174; an n ohmic contact plug 172, which is provided in a lower portion of each of through holes formed in the transparent insulating layer; an n-type GaAs plug 110 provided in an upper portion of the through hole; an n cladding layer 121 provided on the transparent insulating layer 170; an active layer 126 provided on the n cladding layer 121; a p cladding layer 127 provided on the active layer 126; a p-type GaP window layer 130 provided on the p cladding layer 127; a p ohmic contact pattern 142 provided on the p-type GaP window layer; a transparent conductive metal oxide pattern 144 provided on the p ohmic contact layer; and a p electrode pad 150 provided on the transparent conductive metal oxide.

The conductive substrate 176 may be a conductive silicon substrate or a metal substrate. A process of bonding the conductive substrate 176 may be performed, after a lower structure of the device is formed. A wafer bonding layer (not shown) may be provided between the conductive substrate 176 and the metal reflection layer 174. The wafer bonding layer may be or include at least one of Sn-containing alloys (e.g., Au/Sn or Ni/Sn alloys). The wafer bonding layer (not shown) may be bonded to the conductive substrate by a low temperature thermal treatment process at temperature of about 200° C.

The metal reflection layer 174 may be configured to reflect light emitted from the active layer 126. The metal reflection layer 174 may be formed of or include a silver (Ag) or silver alloy material whose reflectance is high within a red and infrared wavelength range.

The transparent insulating layer 170 and the n ohmic contact plug 172 may be provided to form an omni-directional reflector (ODR) structure. The transparent insulating layer 170 may be formed of or include a transparent dielectric material (e.g., silicon oxide or magnesium fluoride) with a low refractive index.

The n ohmic contact plug 172 and the n-type GaAs plug 110 may be provided to form an ohmic contact. The n ohmic contact plug 172 may be formed of or include Au or AuGe. The n-type GaAs plug 110 may have a small band gap, and thus, it may absorb light generated in the active layer 126. Accordingly, when viewed in a plan view, the n ohmic contact plug 172 may be provided to be aligned with the n-type GaAs plug 110, and thus, the n ohmic contact plug 172 may have a minimized area.

The n-type GaAs plug 110 may be highly doped with n-type impurities. The n-type GaAs plug 110 may have a height or thickness of about 50 nm. The n-type GaAs plug 110 may have a top surface that is substantially coplanar with that of the transparent insulating layer 170.

The n cladding layer 121 may be provided on the transparent insulating layer 170 and the n-type GaAs plug 110. The n cladding layer 121, the active layer 126, the p cladding layer 127 may be provided to constitute a dual hetero junction structure. The n cladding layer 121 may include an n-type AlGaInP layer 122 and an n-type AlInP layer 124 which are sequentially stacked. The n-type AlGaInP layer 122 may be provided on the n-type GaAs plug 110. The n-type AlGaInP layer 122 and the n-type AlInP layer 124 may be doped with n-type impurities. The n-type AlInP layer 124 may be provided on the n-type AlGaInP layer 122. The n-type cladding layer 121 may be a semiconductor layer, whose band gap is greater than that of the active layer 126, and may be used to confine electrons or holes.

The active layer 126 may be provided on the n cladding layer 121 and may be an undoped or intrinsic semiconductor layer. The active layer 126 may be formed of or include AlGaInP. The active layer 126 may be an undoped AlGaInP/AlGaInP multiple quantum well (MQW) structure. The active layer 126 may be configured to emit red or infrared light.

The p cladding layer 127 may be provided on the active layer 126. The p cladding layer 127 may include a p-type AlInP layer 128 and a p-type AlGaInP layer 129 which are sequentially stacked. The p cladding layer 127 may be used as a layer confining electrons or holes. The p-type AlInP layer 128 and the p-type AlGaInP layer 129 may be doped with p-type impurities.

The p-type GaP window layer 130 may be provided on the p cladding layer 127. The p-type GaP window layer 130 may a GaP layer that is doped with p-type impurities. The p-type GaP window layer 130 may include a several µm thick magnesium-lightly-doped layer and a several nm thick carbon-highly-doped layer, which are sequentially stacked. The p-type GaP window layer 130 may be used as a current spreading layer. Lattice mismatch may occur between the p-type GaP window layer 130 and the AlGaInP layer 129 thereunder. To reduce an effect caused by the lattice mismatch, the p-type GaP window layer 130 may be provided to have a sufficiently large thickness. A top surface of the p-type GaP window layer 130 may have a sufficiently high surface roughness. The higher the surface roughness, the higher the light extraction efficiency.

The p ohmic contact pattern 142 may be provided on the p-type GaP window layer 130. The p ohmic contact pattern 142 and the p-type GaP window layer 130 may be provided to form an ohmic junction. The transparent conductive metal oxide pattern 144 may be vertically aligned with the p ohmic contact pattern 144, and the p ohmic contact pattern and the transparent conductive metal oxide pattern 144 may provide a current spreading effect and may serve as an electrode with low resistance and high transmittance. A thickness of the p ohmic contact pattern 142 may be less than or equal to 20 nm, and the p ohmic contact pattern 142 may be formed of or include at least one of Au, AuBe, Ni, NiZn, NiBe, Pd, PdZn, or PdBe. After the formation of the p ohmic contact pattern 142, a thermal treatment process may be performed at temperature of 300° C. to 400° C. As a result of the thermal treatment process, it may be possible to reduce a specific contact resistance of the electrode and increase an optical transmittance of the electrode. Owing to such a low-temperature thermal treatment process, it may be possible to prevent or suppress the conductive substrate from being damaged. The p ohmic contact pattern 142 may be or include a metal or metal alloy having a work function of 4.8 eV or larger.

The transparent conductive metal oxide pattern 144 may be formed of or include at least one of indium tin oxide (ITO), ZnO, aluminum-doped zinc oxide (Al—ZnO; AZO), gallium-doped zinc oxide (GZO), or In—Ga ZnO (IGZO). The transparent conductive metal oxide pattern 144 may have a thickness ranging from 10 nm to 100 nm. A material for the transparent conductive metal oxide pattern 144 may be selected to have a refractive index less than that of the p-type GaP window layer 130. Accordingly, it may be possible to reduce a difference in refractive index between the p-type GaP window layer 130 and the air and thereby to suppress the total internal reflection. Thus, it may be possible to increase the overall light extraction efficiency of the LED device. The transparent conductive metal oxide pattern may have a multi-layered structure having a gradually-decreasing refractive index.

In some embodiments, the p ohmic contact pattern 142 may be a 10 nm-thick Au layer, and the transparent conductive metal oxide pattern 144 may be a 40 nm-thick ITO layer. In the case where the electrode of Au (10 nm)/ITO (40 nm) is thermally treated at temperature of 400° C.-500° C., it may exhibit a transmittance of 90% or higher within a wavelength range of red light or from 600 nm to 650 nm. Furthermore, the electrode of Au (10 nm)/ITO (40 nm) may exhibit an ohmic junction property and may have a low contact resistance property, when it is in contact with the p-type GaP window layer 130.

The p ohmic contact pattern 142 may be a 10 nm-thick AuBe layer, and the transparent conductive metal oxide pattern 144 may be a 40 nm-thick IGZO layer.

In certain embodiments, the p ohmic contact pattern 142 and the transparent conductive metal oxide pattern 144 may be extended to fully cover the p-type GaP window layer 130.

The p electrode pad 150 may be provided on the transparent conductive metal oxide pattern 144. The p electrode pad 150 may be formed of gold (Au) and may have an area smaller than that of the transparent conductive metal oxide pattern 144. Accordingly, by reducing an area of the p electrode pad 150, it may be possible to reduce or minimize an amount of light to be absorbed by the p electrode pad 150.

In some embodiments, a method of fabricating a light-emitting diode device may include sequentially stacking a first n-GaAs layer 104, an n-GaInP layer 106, a second n-GaAs layer 110a, an n cladding layer 121, an active layer 126, a p cladding layer 127, and a p-type GaP layer 130 on a GaAs substrate 102; forming a p ohmic contact pattern 142 and a transparent conductive metal oxide pattern 144 on the p-type GaP layer 130; forming a p electrode pad 150 on the transparent conductive metal oxide pattern; bonding a temporary substrate 160 on the p electrode pad 150 and then removing the GaAs substrate 102, the first n-GaAs layer 104, and the n-GaInP layer 106; patterning the second n-GaAs layer 110a to form an n-type GaAs plug 110; forming a transparent insulating layer 170 on the n cladding layer and the n-type GaAs plug and patterning the transparent insulating layer to form an n ohmic contact plug 172 aligned to the n-type GaAs plug; forming a metal reflection layer 174 on the transparent insulating layer and the n ohmic contact plug and then attaching a conductive substrate 176 to the metal reflection layer; and removing the temporary substrate 160.

FIGS. 2A to 2F are sectional views illustrating a method of fabricating a light-emitting diode device, according to some embodiments of the inventive concept.

Figure 2A:
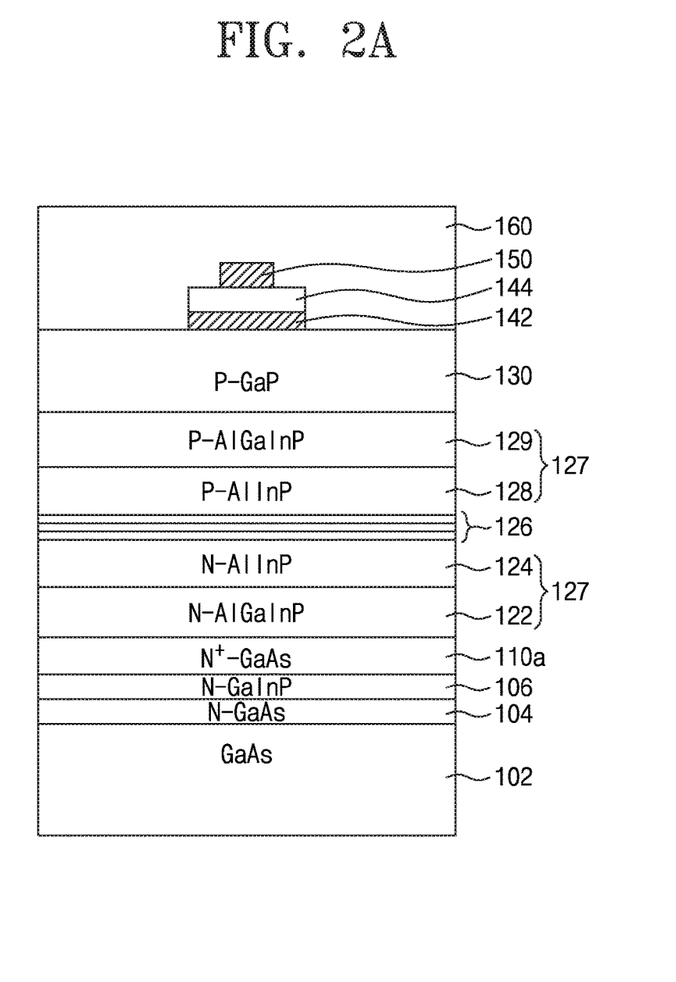
FIGS. 2A to 2F are sectional views illustrating a method of fabricating a light-emitting diode device, according to some embodiments of the inventive concept.

Referring to FIG. 2A, a first n-GaAs layer 104, an n-GaInP layer 106, a second n-GaAs layer 110a, an n cladding layer 121, an active layer 126, a p cladding layer 127, and a p-type GaP layer 130 may be sequentially stacked on a GaAs substrate 102.

Each of the first n-GaAs layer 104, the n-GaInP layer 106, the second n-GaAs layer 110a, the n cladding layer 121, the active layer 126, and the p cladding layer 127 may be an epitaxial layer grown using a metal organic chemical vapor deposition (MOCVD) process. The n cladding layer 121 may include an n-type AlGaInP layer 122 and an n-type AlInP layer 124 which are sequentially stacked on the GaAs substrate 102. The p cladding layer 127 may include a p-type AlInP layer 128 and a p-type AlGaInP layer 129 which are sequentially stacked on the GaAs substrate 102. The p-type GaP layer 130 may be grown by an MOCVD process. The second n-GaAs layer 110a may be a GaAs layer that is highly doped with n-type impurities. The active layer 126 may be an undoped AlGaInP/AlGaInP multiple quantum well (MQW) structure.

Next, a p ohmic contact pattern 142 and a transparent conductive metal oxide pattern 144 may be formed on the p-type GaP layer 130. The p ohmic contact pattern 142 and the transparent conductive metal oxide pattern 144 may be formed by a lift-off process. For example, a photoresist mask with an opening may be formed on the p-type GaP layer 130, and here, the opening may be formed at a position of the p ohmic contact pattern 142 and the transparent conductive metal oxide pattern 144. A material for the p ohmic contact pattern 142 may be deposited on the photoresist mask, and the material for the p ohmic contact pattern 142 may be or include at least one of Au, AuBe, Ni, NiZn, NiBe, Pd, PdZn, or PdBe. Thereafter, a material for the transparent conductive metal oxide pattern 144 may be deposited. In some embodiments, the material for the transparent conductive metal oxide pattern 144 may be or include at least one of indium tin oxide (ITO), ZnO, aluminum-doped zinc oxide (Al—ZnO; AZO), gallium-doped zinc oxide (GZO), or In—Ga ZnO (IGZO). Next, the photoresist mask may be removed.

The p ohmic contact pattern 142 may be formed to have a thickness of 20 nm or lower, and the p ohmic contact pattern 142 may be formed of or include at least one of Au, AuBe, Ni, NiZn, NiBe, Pd, PdZn, or PdBe. The transparent conductive metal oxide pattern 144 may be formed of or include at least one of indium tin oxide (ITO), ZnO, aluminum-doped zinc oxide (Al—ZnO; AZO), gallium-doped zinc oxide (GZO), or In—Ga ZnO (IGZO). In some embodiments, the p ohmic contact pattern 142 may be a 10 nm-thick Au layer, and the transparent conductive metal oxide pattern 144 may be a 40 nm-thick ITO layer. In certain embodiments, the p ohmic contact pattern 142 may be a 10 nm-thick AuBe layer, and the transparent conductive metal oxide pattern 144 may be a 40 nm-thick IGZO layer.

Next, the substrate with the p ohmic contact pattern 142 and the transparent conductive metal oxide pattern 144 may be thermally treated at a temperature of 300° C. to 400° C. As a result of the thermal treatment, the device may have a reduced specific contact resistance and an increased transmittance.

Thereafter, a lift-off process may be performed to form a p electrode pad 150 on the transparent conductive metal oxide pattern 144. The p electrode pad 150 may be formed of or include a gold layer.

Next, a temporary substrate 160 may be bonded to the p electrode pad 150. For example, the temporary substrate 160 may be bonded to the GaAs substrate 102 provided with the p electrode pad 150. The temporary substrate 160 may be a sapphire substrate. The temporary substrate 160 may be bonded to the GaAs substrate 102 by an adhesive material.

Figure 2B:
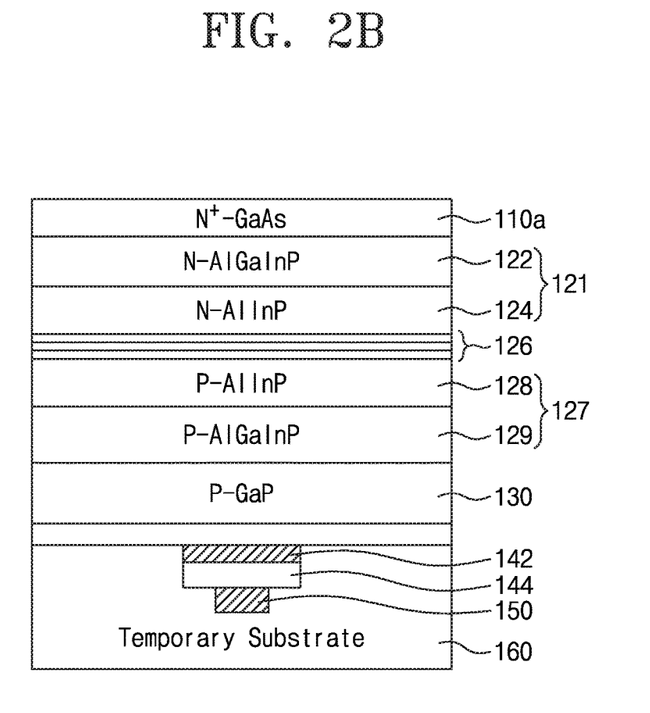

Referring to FIG. 2B, the GaAs substrate 102, the first n-GaAs layer 104, and the n-GaInP layer 106 may be removed. The GaAs substrate 102, the first n-GaAs layer 104, and the n-GaInP layer 106 may be removed by a wet etching process. The n-GaInP layer 106 may be used as an etch stop layer.

Figure 2C:
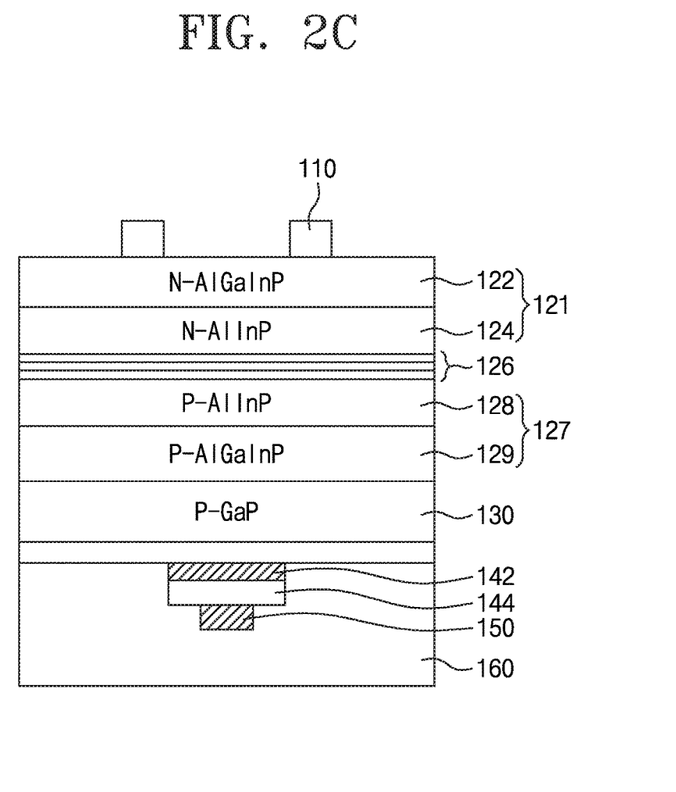

Referring to FIG. 2C, the second n-GaAs layer 110a may be patterned to form an n-type GaAs plug 110. In some embodiments, a plurality of the n-type GaAs plugs 110 may be regularly and two-dimensionally arranged, and each of them may be a pillar- or island-shaped structure.

Figure 2D:
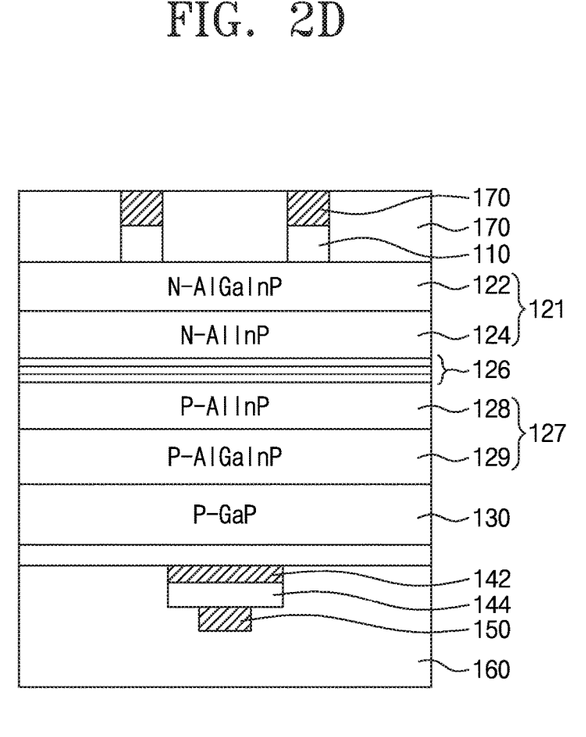

Referring to FIG. 2D, a transparent insulating layer 170 may be formed on the n cladding layer 121 and the n-type GaAs plug 110, and then, the transparent insulating layer 170 may be patterned to form an n ohmic contact plug 172 that is aligned to the n-type GaAs plug 110. For example, the transparent insulating layer 170 may be deposited on the n cladding layer 121 and the n-type GaAs plug 110. The transparent insulating layer 170 may be a silicon-oxide or magnesium-fluoride layer having a low refractive index. A photomask pattern may be formed on the transparent insulating layer 170. The n-type GaAs plug 110 may be exposed by pattering the transparent insulating layer 170 using the photomask as an etch mask. A material for the n ohmic contact plug 172 may be deposited on the exposed n-type GaAs plug. The material for the n ohmic contact plug 172 may be or include Au or AuGe. Thereafter, the photomask may be removed, and thus, the n ohmic contact plug 172 may be formed.

Figure 2E:
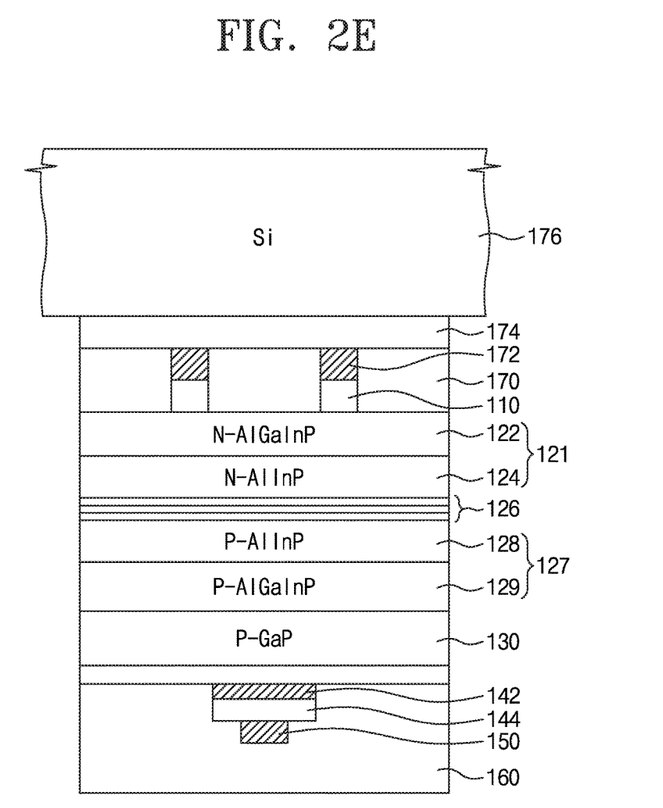

Referring to FIG. 2E, a metal reflection layer 174 may be formed on the transparent insulating layer 170 and the n ohmic contact plug 172, and then, a conductive substrate 176 may be attached to the metal reflection layer 174. In detail, the metal reflection layer 174 may be formed on the substrate provided with the n ohmic contact plug 172. The metal reflection layer 174 may be formed of or include at least one of silver (Ag) or silver alloys.

Thereafter, a wafer bonding layer may be deposited. The wafer bonding layer may be or include at least one of Sn-containing alloys (e.g., Au/Sn or Ni/Sn alloys). A conductive substrate may be provided on the wafer bonding layer. A thermal treatment process may be performed at a process temperature of about 200° C. to bond the conductive substrate 176 to the temporary substrate 160.

Figure 2F:
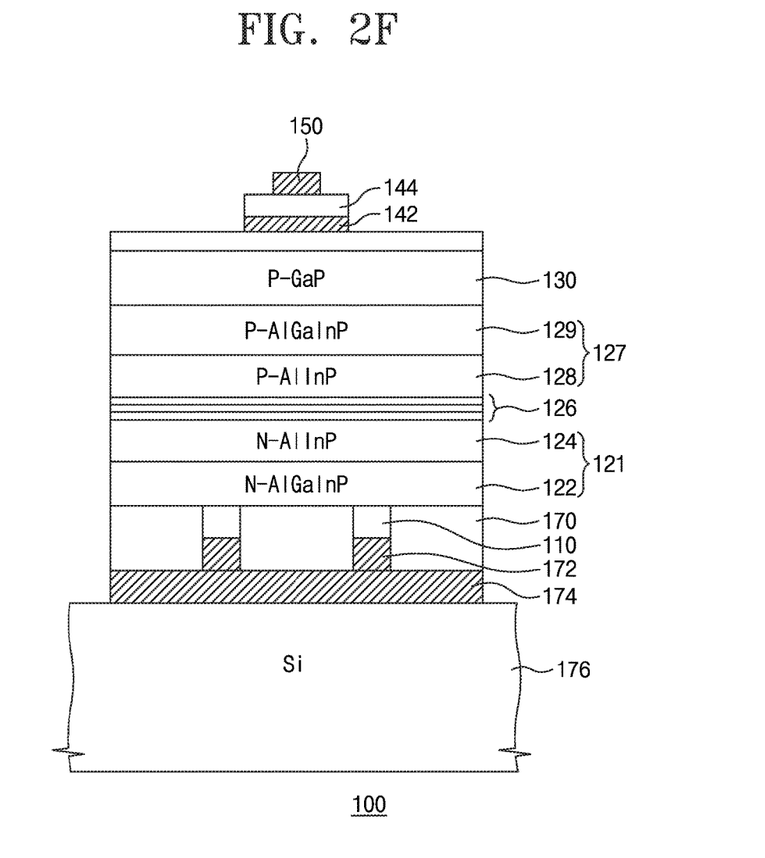

Referring to FIG. 2F, the temporary substrate 160 may be removed. The temporary substrate may be removed by organic solvent.

Referring back to FIG. 1B, an etching process using a photomask as an etch mask may be performed to etch the p-type GaP layer 130, the p cladding layer 127, the active layer 126, the n cladding layer 121, and the transparent insulating layer 170 and thereby to form devices separated from each other. Next, a protection layer 180 may be formed to cover side surfaces of the p-type GaP layer 130, the p cladding layer 127, the active layer 126, the n cladding layer 121, and the transparent insulating layer 170.

According to some embodiments of the inventive concept, a conductive metal oxide material (e.g., ITO, IGZO, AZO, and GZO) is used as a material for an electrode of a p-side up AlGaInP-based LED device. The conductive metal oxide material has a low sheet resistance and a high optical transmittance within a red and/or infrared wavelength range. An amount of light, which is absorbed by the electrode or which is reflected by the electrode and is re-absorbed by the substrate, may be reduced when compared to the conventional metal electrode, and thus, light extraction efficiency of the LED device may be increased. A refractive index of a transparent electrode may be less than that of a GaP material serving as a current spreading layer, and thus, it may be possible to reduce a difference in refractive index between the LED device and the air. Accordingly, it may be possible to suppress optical loss, which may be caused by total internal reflection. That is, it may be possible to increase light extraction efficiency of the LED device.

Figure 3:
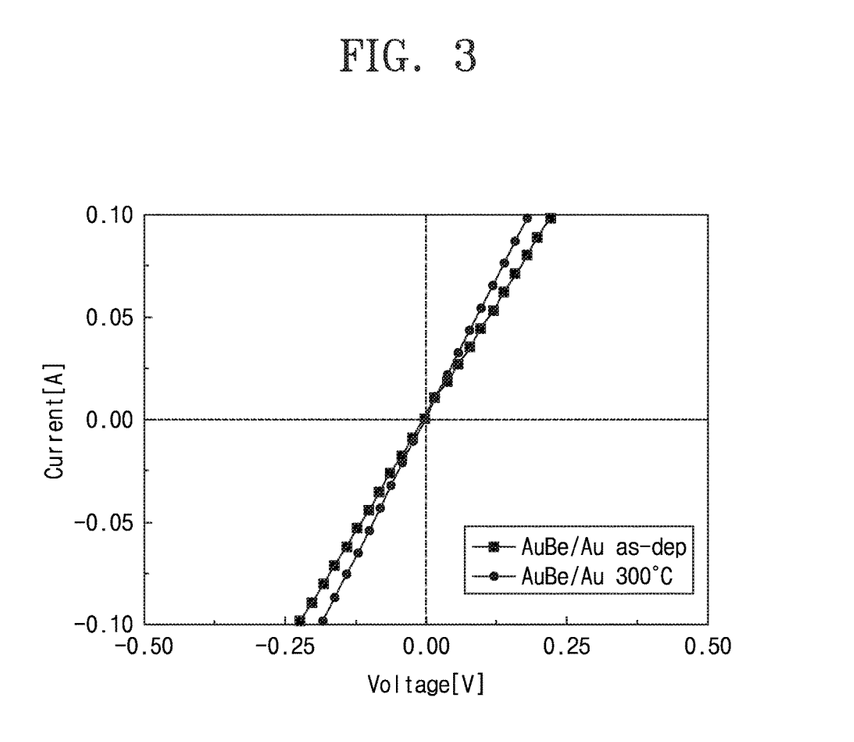
FIG. 3 is a graph showing a voltage-current property, when a conventional p metal electrode (AuBe/Au) is used.

FIG. 3 is a graph showing a voltage-current property, when a conventional p metal electrode (AuBe/Au) is used.

The voltage-current property of FIG. 3 was obtained from a structure including a GaP layer and a p metal electrode of AuBe (130 nm)/Au (100 nm). FIG. 3 shows that the structure has high electric resistance.

In this structure, transmittance is zero in the wavelength range of red light.

Figure 4:
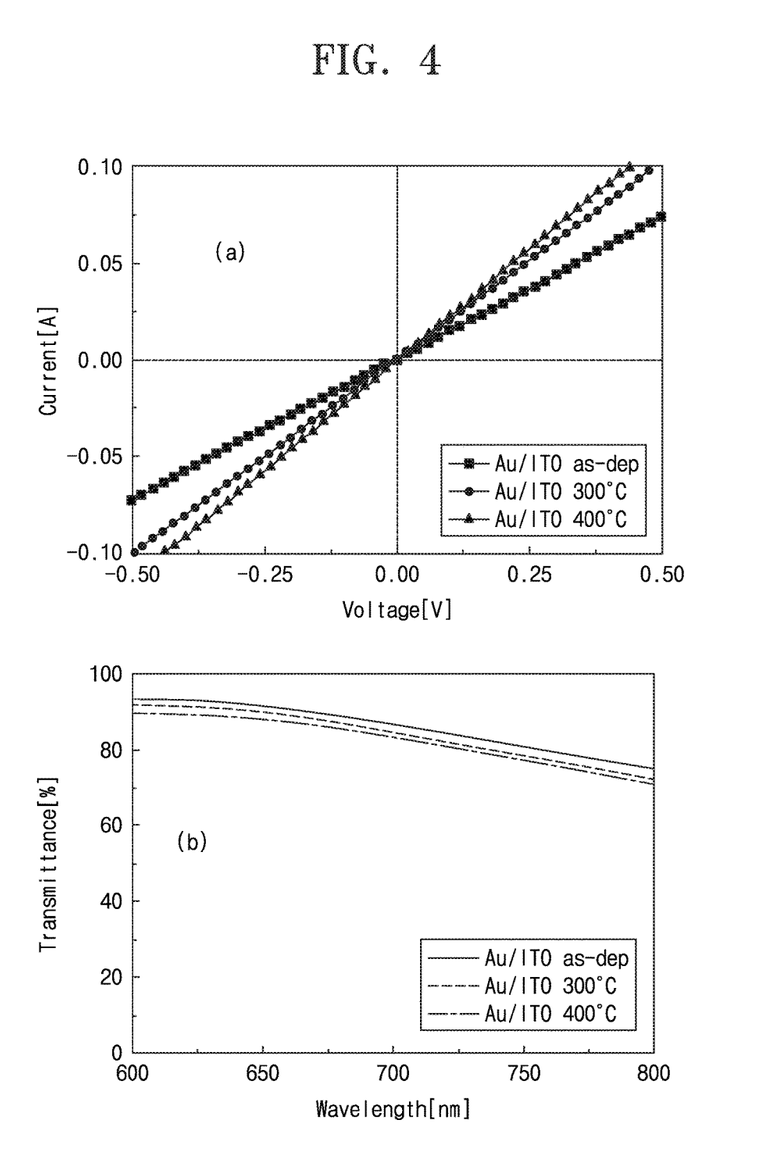
FIG. 4 is graphs showing a voltage-current property and a wavelength-transmittance property, when a p metal electrode of Au (10 nm)/ITO (40 nm) according to some embodiments of the inventive concept is used.

FIG. 4 is graphs showing a voltage-current property and a wavelength-transmittance property, when a p metal electrode of Au (10 nm)/ITO (40 nm) according to some embodiments of the inventive concept is used.

As shown in FIG. 4, the structure with the p metal electrode had a low resistance property. A specific contact resistance of the structure was $1.2 \times 10^{-3}$ $\Omega cm^2$ when there was no thermal treatment process. The structure had specific contact resistances of $6.5 \times 10^{-4}$ $\Omega cm^2$ and $4.4 \times 10^{-4}$ $\Omega cm^2$, when it was thermally treated at 300° C. and 400° C., respectively. Transmittance of the structure was 88.7%, when there was no thermal treatment process. The structure had transmittance of 90.3% and 92.4%, when it was thermally treated at 300° C. and 400° C., respectively.

Figure 5:
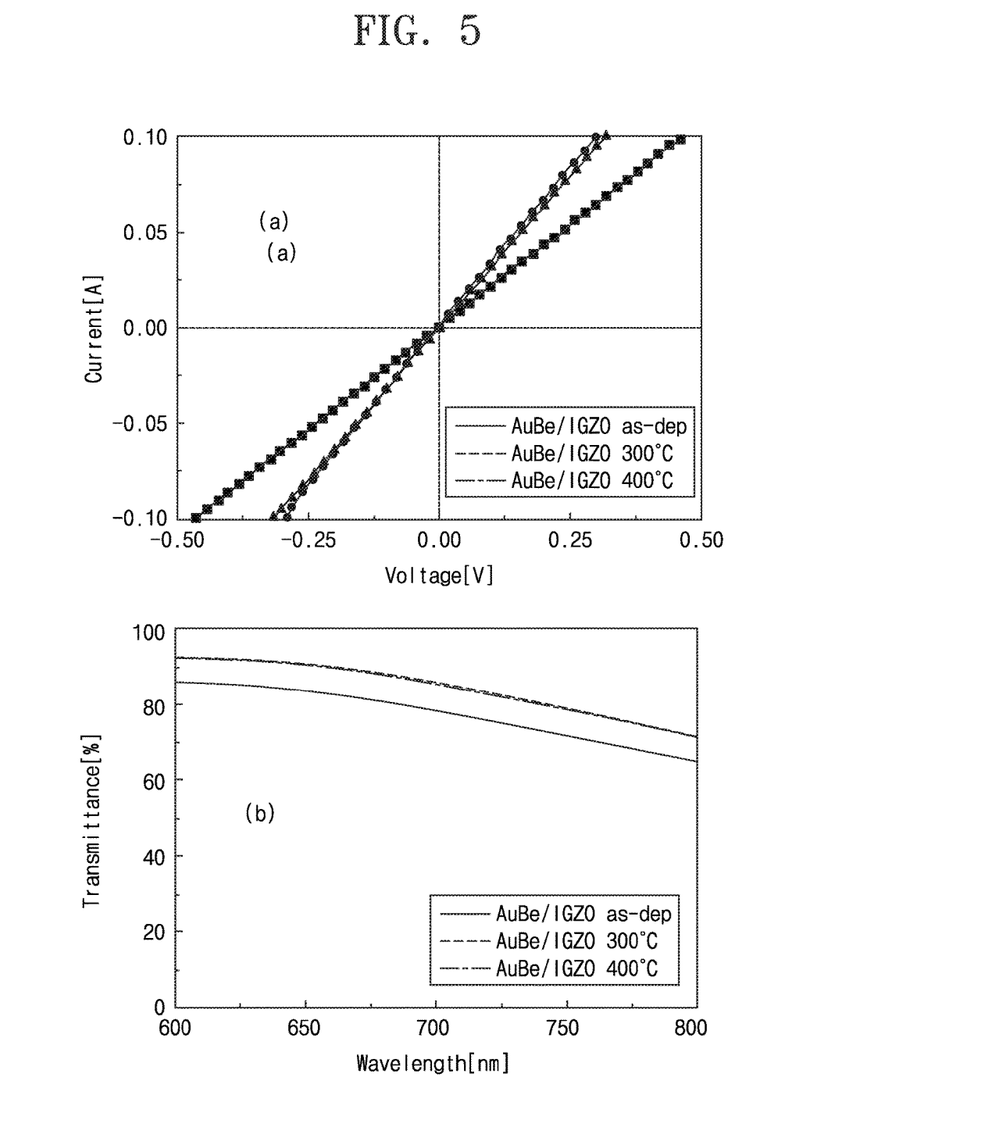
FIG. 5 is graphs showing a voltage-current property and a wavelength-transmittance property, when a p metal electrode of AuBe (10 nm)/IGZO (40 nm) according to some embodiments of the inventive concept is used.

FIG. 5 is graphs showing a voltage-current property and a wavelength-transmittance property, when a p metal electrode of AuBe (10 nm)/IGZO (40 nm) according to some embodiments of the inventive concept is used.

As shown in FIG. 5, the structure with the p metal electrode had a low resistance property. A specific contact resistance of the structure was $6.0 \times 10^{-4}$ $\Omega cm^2$ when there was no thermal treatment process. The structure had specific contact resistances of $2.1 \times 10^{-4}$ $\Omega cm^2$ and $2.2 \times 10^{-4}$ $\Omega cm^2$, when it was thermally treated at 300° C. and 400° C., respectively. Transmittance of the structure was 84.5%, when there was no thermal treatment process. The structure had transmittance of 91.6% and 91.4%, when it was thermally treated at 300° C. and 400° C., respectively.

To overcome the high contact resistance issue between the conductive metal oxide and the p-type semiconductor (GaP) layer, a metal layer (e.g., of Au, AuBe, AuGe, Ni, and Pdl), which can exhibit an ohmic property when it is in contact with the p-type semiconductor layer, may be inserted between the conductive metal oxide and the p-type semiconductor layer. For example, an Au/ITO transparent electrode may be provided on the p-GaP window layer. In the case where an electrode of Au (about 10 nm)/ITO (about 40 nm) is thermally treated at temperature of 400-500° C., it may have transmittance of 90% or higher within a wavelength range of red light or from 600 nm to 650 nm. In addition, the Au/ITO transparent electrode may exhibit an ohmic property and may have a low contact resistance property, when it is in contact with the p-GaP window layer.

According to some embodiments of the inventive concept, a conductive metal oxide material (e.g., ITO, IGZO, AZO, and GZO) may be used as a material for a transparent electrode. Since the conductive metal oxide material has a low sheet resistance and a high optical transmittance in a red and infrared wavelength range, it is possible to realize high light extraction efficiency, compared to the case that the electrode is formed of a metal. In addition, it is possible to improve a current spreading property and improve optical efficiency of an LED device, compared to the case that the electrode is formed of a general metallic material.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a light-emitting diode device, comprising:
    sequentially stacking a first n-GaAs layer, an n-GaInP layer, a second n-GaAs layer, an n cladding layer, an active layer, a p cladding layer, and a p-type GaP layer on a GaAs substrate;
    sequentially stacking a p ohmic contact pattern and a transparent conductive metal oxide pattern on the p-type GaP layer;

forming a p electrode pad on the transparent conductive metal oxide pattern;

bonding a temporary substrate on the p electrode pad and removing the GaAs substrate, the first n-GaAs layer, and the n-GaInP layer;

patterning the second n-GaAs layer to form n-type gallium arsenide (GaAs) plugs;

forming a transparent insulating layer on the n cladding layer and the n-type GaAs plugs and patterning the transparent insulating layer to form through holes in the transparent insulating layer;

forming n ohmic contact plugs in the through holes, vertically aligned with the n-type GaAs plugs such that the n-type GaAs plugs and the n ohmic contact plugs are embedded in the transparent insulating layer;

forming a metal reflection layer on the transparent insulating layer and the n ohmic contact plugs and attaching a conductive substrate onto the metal reflection layer; and removing the temporary substrate.

2. The method of claim 1, further comprising thermally treating a substrate having the p ohmic contact pattern and the transparent conductive metal oxide pattern thereon at a temperature of 300° C.-400° C.

3. The method of claim 1, wherein a thickness of the p ohmic contact pattern is less than or equal to 20 nm, the p ohmic contact pattern comprises at least one of Au, AuBe, Ni, NiZn, NiBe, Pd, PdZn, or PdBe, and the transparent conductive metal oxide pattern comprises at least one of indium tin oxide (ITO), ZnO, aluminum-doped zinc oxide (Al—ZnO; AZO), gallium-doped zinc oxide (GZO), or In—Ga ZnO (IGZO).

4. The method of claim 1, wherein the p ohmic contact pattern is a 10 nm-thick Au layer, and the transparent conductive metal oxide pattern is a 40 nm-thick ITO layer.

5. The method of claim 1, wherein the p ohmic contact pattern is a 10 nm-thick AuBe layer, and the transparent conductive metal oxide pattern is a 40 nm-thick IGZO layer.

6. The method of claim 1, wherein the n cladding layer comprises an n-type AlGaInP layer and an n-type AlInP layer in sequence, and the p cladding layer comprises a p-type AlInP layer and a p-type AlGaInP layer in sequence.

7. The method of claim 1, wherein the active layer is configured to emit light, and the metal reflection layer is configured to reflect the light emitted from the active layer.

8. The method of claim 7, wherein the metal reflection layer includes silver (Ag) or a silver alloy.

9. The method of claim 1, wherein the transparent insulating layer includes a silicon oxide or magnesium fluoride.

10. The method of claim 1, wherein patterning the transparent insulating layer comprises forming a photomask pattern on the transparent insulating layer and exposing the n-type GaAs plugs by etching the transparent insulating layer using the photomask pattern as an etch mask, and forming the n ohmic contact plugs comprises depositing a material for the n ohmic contact plugs on the exposed n-type GaAs plug, and removing the photomask.

11. The method of claim 10, wherein the n ohmic contact plugs and the n-type GaAs plugs together form an ohmic contact in the transparent insulating layer.

12. The method of claim 10, wherein the n ohmic contact plugs includes Au or AuGe.

13. The method of claim 10, wherein the transparent insulating layer comprises a silicon-oxide or magnesium-fluoride layer.

14. The method of claim 10, wherein the material for the n ohmic contact plugs includes Au or AuGe.

15. The method of claim 1, wherein the conductive substrate comprises a conductive silicon substrate or a metal substrate.

16. The method of claim 1, further comprising, prior to attaching the conductive substrate onto the metal reflection layer, providing a wafer bonding layer on the conductive substrate, and bonding the conductive substrate to the metal reflection layer.

17. The method of claim 16, wherein the wafer bonding layer includes at least one Sn-containing alloy bonded to the conductive substrate by a thermal treatment process at temperature of about 200° C.

18. The method of claim 1, wherein the active layer is an undoped or intrinsic semiconductor layer.

19. The method of claim 18, wherein the active layer includes AlGaInP and is configured to emit red or infrared light.

20. The method of claim 1, wherein the p cladding layer includes a p-type AlInP layer and a p-type AlGaInP layer in sequence.

* * * * *